US005262720A

United States Patent [19]

Senn et al.

[11] Patent Number: 5,262,720

[45] Date of Patent: Nov. 16, 1993

[54] CIRCUIT FOR CONTROLLING THE LINES OF A DISPLAY SCREEN AND INCLUDING TEST MEANS WITH A SINGLE OUTPUT

[75] Inventors: Patrice Senn; Alan Lelah, both of Grenoble; Gilbert Martel, Meylan; Denis Pradel, Pierelaye, all of France

[73] Assignees: France Telecom Etablissement Autonome de Droit Public (Centre National D'Etudes des Telecommunications), Issy Les Moulineaux; Societe D'Applications Generales D'Electricite et de Mecanique Sagem, Paris, both of France

[21] Appl. No.: 774,521

[22] Filed: Oct. 8, 1991

[30] Foreign Application Priority Data

Oct. 9, 1990 [FR] France ................................ 90 12419

[51] Int. Cl.[5] ...................... G01R 31/00; G01R 15/12

[52] U.S. Cl. ................................ 324/158 R; 324/73.1; 324/537; 345/211; 345/87

[58] Field of Search ................... 324/158 R, 537, 548, 324/73.1; 340/811, 784, 765

[56] References Cited

U.S. PATENT DOCUMENTS

| | | | |
|---|---|---|---|
| 5,065,090 | 11/1991 | Gheewala | 324/158 R |
| 5,113,134 | 5/1992 | Plus et al. | 324/158 R |
| 5,184,082 | 2/1993 | Nelson | 324/537 |

FOREIGN PATENT DOCUMENTS

| | | |
|---|---|---|
| 0189615 | 6/1986 | European Pat. Off. . |
| 1-130132 | 5/1989 | Japan . |
| 2113444 | 1/1982 | United Kingdom . |
| 2135098 | 12/1983 | United Kingdom . |

*Primary Examiner*—Kenneth A. Wieder
*Assistant Examiner*—Glenn W. Brown
*Attorney, Agent, or Firm*—Oblon, Spivak, McClelland, Maier & Neustadt

[57] ABSTRACT

A circuit for controlling the lines of a display screen and including a test means with a single output is disclosed. The test means includes a single test control line (LCT), a single test output line (LST) and a plurality of sample holders (CEBj) and associated gates (Pj) and switches (Ij). The output voltage of the sample holders is transmitted onto a test output block (ST).

2 Claims, 3 Drawing Sheets

CIRCUIT FOR CONTROLLING THE LINES OF A DISPLAY SCREEN AND INCLUDING TEST MEANS WITH A SINGLE OUTPUT

FIELD OF THE INVENTION

The present invention concerns a circuit for controlling the lines of a display screen and including test means having a single output. In particular, the invention is applicable for controlling display screens and in particular liquid crystal display screens.

BACKGROUND OF THE INVENTION

A liquid crystal display screen generally appears in the form shown on FIG. 1. The actual screen ECR is constituted by addressing lines L and addressing columns C, a matrix of pixels P, each connected to a transistor TFT whose state is controlled by the associated line L and column C.

This screen is controlled by a line control circuit CCL which sequentially applies to the lines an addressing voltage (for example, several tens of volts) and by a column control circuit CCC which applies to all the columns voltages reflecting the light intensity of the points to be displayed on the addressed line. The overall image is thus displayed line by line.

The column control circuit CCC receives a video signal SV delivered by a video circuit CV. Generally speaking, this signal is made up of three components corresponding to the three primary components of a color image.

If the ECR screen has 162 columns, the circuit CCC includes 162 parallel-disposed elementary column control circuits and 162 outputs connected to the various columns. Each elementary column control circuit (still technically known as a "column driver") includes a sample holder whose function is to sample the video signal at a specific moment and corresponding to the column to be controlled and to retain this sample on the column throughout the period for addressing a line (known as a "sample-and-hold" function).

So as to verify the proper functioning of such a column control circuit, at the moment the latter is produced, voltages are measured with the aid of points placed in contact with various points of the integrated circuit.

This conventional technique of carrying out tests under points does have the drawback of being that much more difficult to implement when the number of points to be tested is large.

SUMMARY OF THE INVENTION

The object of the present invention is to resolve this drawback by proposing a control circuit provided with its own test means, the result of the tests appearing on a single output. Thus, if there are 162 sample-and-hold circuits, the circuit of the invention shall merely have one single test output (and not 162) on which the 162 test signals of the 162 sample-holders shall successively appear when controlled by a single control signal.

To this end, the control circuit of the invention includes:

- a first general test output line connected to a test output block,
- a second general test control line connected to a test control block,
- at the output of each sample-and-hold circuit, a test circuit including a switch dipsosed between the output of the sample holder and the test output line, a logic gate with one input connected to the test control line and the other receiving the sampling signal corresponding to the sample-and-hold circuit, the output of this gate controlling the state of the electronic switch.

BRIEF DESCRIPTION OF THE DRAWINGS

The characteristics and advantages of the invention shall appear more readily from a reading of the following description of embodiment examples, given by way of explanation and being non-restrictive, with reference to the accompanying drawings on which FIG. 1, already described, shows an active matrix display screen according to the prior art

DETAILED DESCRIPTION OF THE PREFERRED EMBODIMENTS

Figure 1:
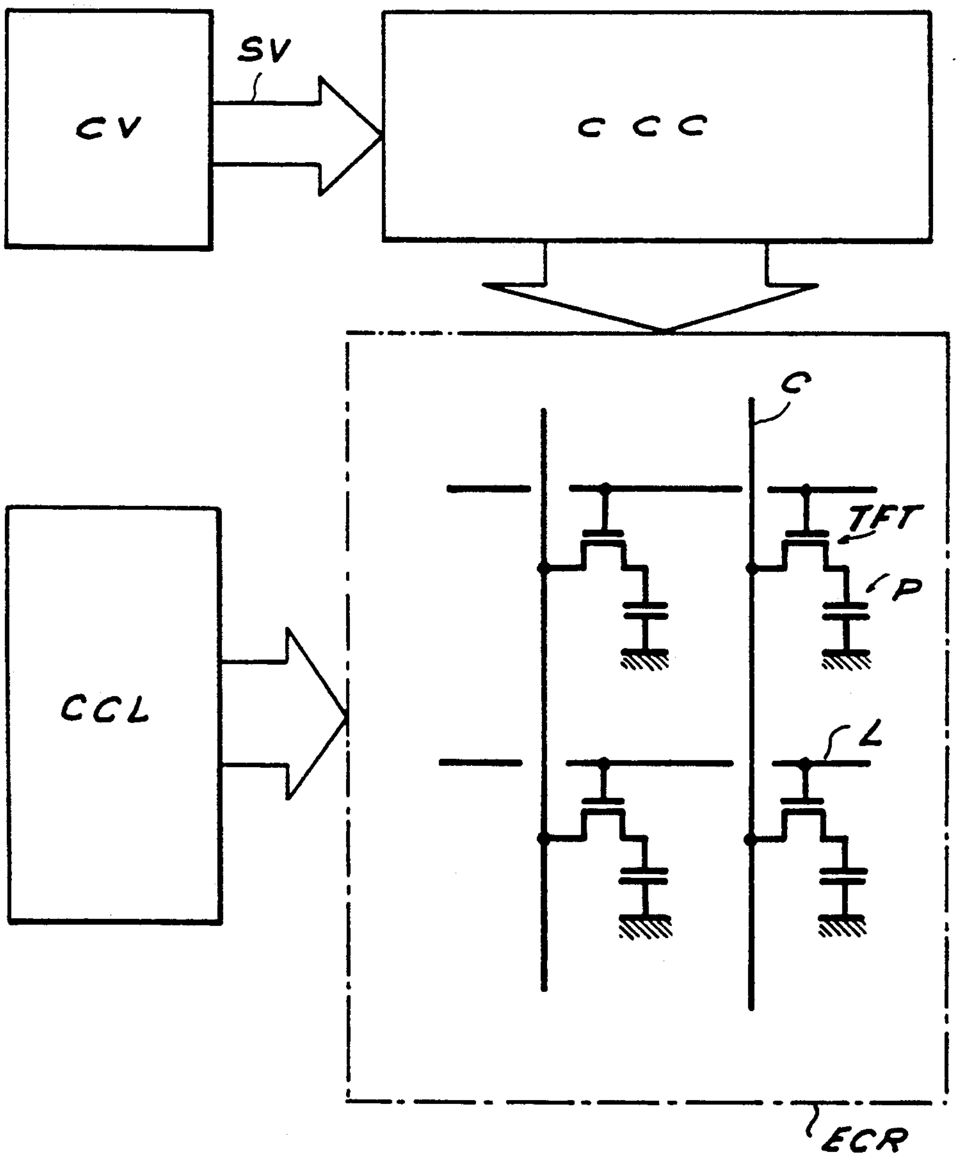
FIG. 1 PRIOR ART
Figure 2:
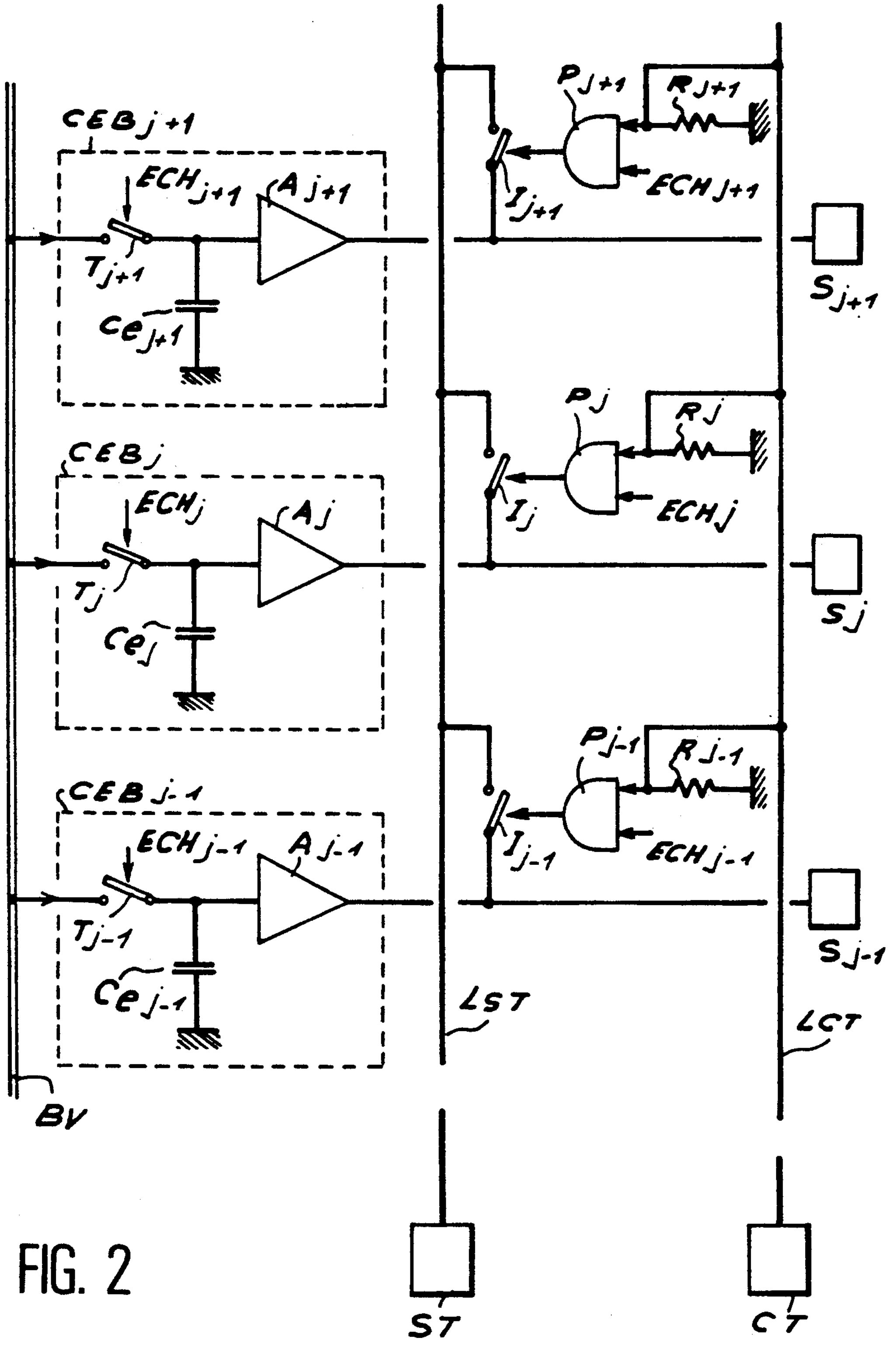
FIG. 2 shows a control circuit conforming to the invention.

The circuit shown on FIG. 2 includes sample-holders with the reference CEB with an index j (respectively j−1 and j+1), this index representing the line of the sample-holder in the overall circuit.

A sample-holder circuit CEBj diagrammatically includes a transistor Tj controlled by a sampling signal ECHj, a sampling capacitor Cej and an amplifier Aj. The input of the sample-holder is connected to a video bus BV.

The following is located at the output of the sample-hold unit:

- a first general test output line LST connected to a test output block ST,
- a second general test control line LCT connected to a test control block CT,
- at the output of each sample-hold circuit CEBj, a test circuit including an electronic switch Ij disposed between the output of the sample-holder CEBj and the general test output line LST, a logic gate Pj with one input being connected to the general test control line LCT and the other input receiving the sampling signal ECHj corresponding to the sample-holder circuit CEBj, the output of this gate Pj controlling the state of the electronic switch Ij.

The input of the gate Pj, intended to receive the test control pulse, is also connected to the ground by means of a resistor Rj.

The functioning of this circuit is as follows: when it is desired to test the functioning of the sampler-holder circuits, a test pulse is applied to the test control block CT. All the logic gates (whatever j) thus receive this signal on one of their inputs. When the gate Pj associated with the sampler holder CEBj also receives on its second input the sampling signal ECHj belonging to the output CEBj, the output of this gate changes state and controls closing of the switch Ij. The output of the sampler holder CEBj (and solely of the latter) is then connected to the general test line LST. The output voltage of the sampler holder thus appears on the test output block ST.

Accordingly, when the test control signal is applied, on each sampling pulse on the block ST, a voltage appears, namely that of the output of the sampler holder controlled by this sampling pulse. Thus, it is possible to instantly check the sound functioning of the entire circuit.

In the absence of any test control signal applied to the block CT, all the gates Pi are closed and the switches Ij are all open. The output of the sampler holders is thus solely controlled on the output blocks Sj.

Figure 3:
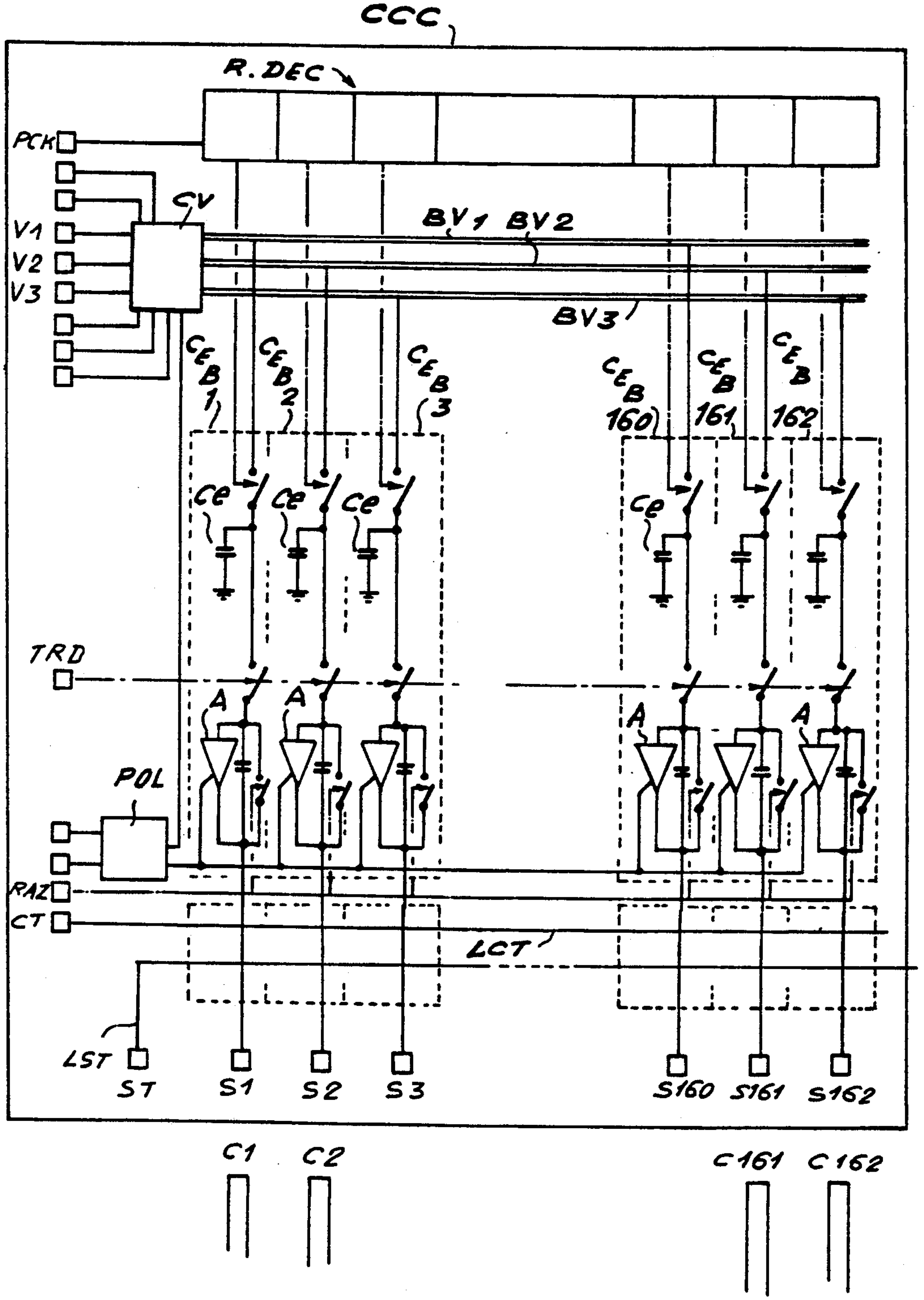
FIG. 3 shows one embodiment example of a control circuit with 162 columns.

FIG. 3 shows one embodiment of a circuit for controlling 162 columns of a display screen implementing the invention. This circuit CCC includes a shift register R DEC with 162 cells successively delivering 162 sampling pulses to 162 sampler holder circuits CEB1, CEB2, . . . , CEB162. These sampler holders are connected to three video buses BV1, BV2 and BV3, these buses being connected to a video circuit CV. A polarization circuit POL ensures the polarizations of the various components, especially the amplifiers of the sampler holders. The circuit includes 162 output blocks S1, S2, . . . S162 intended to be connected to the 162 columns C1, C2, . . . C162.

In accordance with the invention, the circuit includes a test control block CT, a test output block ST and two general lines which traverse the entire circuit in its lower portion, namely the test control line LCT and the test output line LST.

It ought to be mentioned that in other types of embodiments, the switch Ij and the two-input gate Pj may be technically embodied in the form of a single component, namely an electronic switch with two inputs (MOS transistor technically known as a "double gate" transistor), whilst complying with the same functioning as the one described previously.

What is claimed is:

1. A circuit for controlling the columns of a display screen, said screen including addressing lines and addressing columns wherein the control circuit includes a plurality of sampler-holder circuits with each of said sampler-holder circuits being associated with each respected ones of said addressing columns and wherein each of said sampler-holder circuits is controlled by a respective associated sampling signal, said control circuit further including a test means, said test means comprising:

a general test output line connected to a test output block;

a general test control line connected to a test control block;

a plurality of test circuits, each of said test circuits being connected at the output of a respective one of said sampler-holder circuits, each said test circuit including an electronic switch disposed between the output of said sampler-holder circuit and said general test output line, a logic gate with one input connected to said general test control line and another input of said logic gate receiving said associated sampling signal, wherein the output of said logic gate controls the state of said electronic switch.

2. Control circuit according to claim 1 wherein in each test circuit, the electronic switch and the logic gate are embodied by a single component with two inputs.

* * * * *